(12) United States Patent
England et al.

(10) Patent No.: US 8,846,508 B1
(45) Date of Patent: Sep. 30, 2014

(54) METHOD OF IMPLANTING HIGH ASPECT RATIO FEATURES

(71) Applicant: Varian Semiconductor Equipment Associates, Inc., Gloucester, MA (US)

(72) Inventors: Jonathan Gerald England, Horsham (GB); Andrew M. Waite, Beverly, MA (US); Simon Ruffell, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/941,775

(22) Filed: Jul. 15, 2013

(51) Int. Cl.
*H01L 21/00* (2006.01)
*H01L 21/66* (2006.01)
*H01L 21/265* (2006.01)

(52) U.S. Cl.
CPC .............. *H01L 21/265* (2013.01); *H01L 22/12* (2013.01)
USPC ........... 438/506; 438/491; 438/532; 438/542; 438/567; 257/E21.135

(58) Field of Classification Search
None
See application file for complete search history.

(56) References Cited

U.S. PATENT DOCUMENTS

| | | | | |
|---|---|---|---|---|
| 8,384,177 | B2* | 2/2013 | Endo | 257/446 |
| 8,507,342 | B2* | 8/2013 | Hong | 438/243 |
| 8,598,025 | B2* | 12/2013 | Steen et al. | 438/558 |
| 2012/0238046 | A1* | 9/2012 | Yu et al. | 438/45 |

* cited by examiner

*Primary Examiner* — Charles Garber
*Assistant Examiner* — Evren Seven

(57) ABSTRACT

Methods to implant ions into the sidewall of a three dimensional high aspect ratio feature, such as a trench or via, are disclosed. The methods utilize a phenomenon known as knock-in, which causes a first species of ions, already disposed in the fill material, to become implanted in the sidewall when these ions are struck by ions of a second species being implanted into the fill material. In some embodiments, these first species and second species have similar masses to facilitate knock-in. In some embodiments, the entire hole is not completely filled with fill material. Rather, some fill material is deposited, an ion implant is performed to cause knock-in to the sidewall adjacent to the deposited fill material, and the process is repeated until the hole is filled.

18 Claims, 9 Drawing Sheets

METHOD OF IMPLANTING HIGH ASPECT RATIO FEATURES

Embodiments of the present disclosure relate to methods of implanting the sidewalls of high aspect ratio features, specifically to doping a sidewall of a trench or via in a non volatile memory or other device.

BACKGROUND

As the desire to integrate more and more transistors onto a single substrate continues to grow, new technologies are developed. Previously, increases in transistor density were largely achieved by the miniaturization of the transistor itself. However, as geometries have continued to shrink, the widths of certain features, such as transistor gates may be less than ten atomic layers. Thus, there is a physical limit to the degree of miniaturization that is possible.

In an attempt to continuing integrating more transistors on a single device, the concept of vertical devices, also known as 3D devices, has gained momentum. Briefly, traditional transistors are made with the source, drain and gate region horizontally oriented. Vertical gates stack these features in the vertical direction, thereby reducing the horizontal footprint of each device. Various techniques are being proposed by various semiconductor manufacturers.

However, there are challenges associated with vertical devices. Specifically, with respect to certain vertical non-volatile memory (NVM) devices, such as NAND FLASH devices, the concept of string current has been discussed as a potential issue. The string current, or current in the vertical direction in a NVM memory device, is a function of the doping concentration of a polycrystalline channel. Inadequate or non-uniform doping of this channel may degrade the device operating parameters and performance. In addition, non-uniform doping of this channel may affect the threshold voltage of the different cells along that channel. These issues may impact certain types of NVM memory devices, including NAND FLASH devices. Similar challenges requiring controlled doping of vertical layers also occur in other types of NVM memory devices, such as resistive memory cells, which include but are not limited to ReRAM, PCRAM, and CBRAM devices. Additionally, other type of devices may have similar challenges.

Therefore, it would be beneficial if there were a method of doping a sidewall in a high aspect ratio feature, such as the trenches and vias in a vertical NVM device, such that performance parameters were optimized.

SUMMARY

Methods to implant ions into the sidewall of a three dimensional high aspect ratio feature, such as a trench or via, are disclosed. The methods utilize a phenomenon known as knock-in, which causes a first species of ions, already disposed in the fill material, to become implanted in the sidewall when these ions are struck by ions of a second species being implanted into the fill material. In some embodiments, these first species and second species have similar masses to facilitate knock-in. In some embodiments, the entire feature is not completely filled with fill material. Rather, some fill material is deposited, an ion implant is performed to cause knock-in to the sidewall adjacent to the deposited fill material, and the process is repeated until the feature is filled.

According to one embodiment, a process of doping a sidewall in a three-dimensional structure is disclosed, where the three-dimensional structure comprises a stack of alternating layers of different compositions. This method comprises etching a hole through the stack, the hole having a depth and a width; depositing a wall material along the sides of the hole; depositing a thickness of fill material in the hole after depositing of the wall material, where the fill material comprises a first species to be implanted in the wall material via knock-in; and implanting a second species into the deposited fill material, the second species having a mass and energy so as to cause the first species to be laterally dispersed into the wall material adjacent the deposited fill material.

According to a second embodiment, a process of doping a sidewall in a three-dimensional structure is disclosed, where this process comprises depositing an alternating pattern of first and second layers on a substrate, to form a stack; etching a hole through the stack; depositing a wall material on walls of the hole; depositing a fill material into the hole, where the fill material comprises a first species to be implanted in the wall material via knock-in; implanting a second species into the deposited fill material, wherein the ions are implanted into the fill material and on top of the stack; and removing at least one layer from the top of the stack after the implanting.

According to a third embodiment, a process of doping a sidewall in a non-volatile memory device, is disclosed. This process comprises depositing an alternating pattern of first and second layers on a substrate, to form a stack; etching a hole through the stack, the hole have a depth and a width; depositing a wall material on walls of the hole; depositing a thickness of fill material in the hole after depositing of the wall material, the thickness being less than the depth of the hole, where the fill material comprises a first species to be implanted in the wall material via knock-in; implanting a second species into the deposited fill material, the second species being of a mass and energy so as to cause the first species to be laterally dispersed into the wall material adjacent the deposited fill material; performing a subsequent deposition of a thickness of fill material into the hole after the implanting; performing a subsequent implanting of the second species into the fill material, whereby a different portion of the wall material is implanted by knock-in; and repeating the deposition and implanting steps until the hole is filled with fill material.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
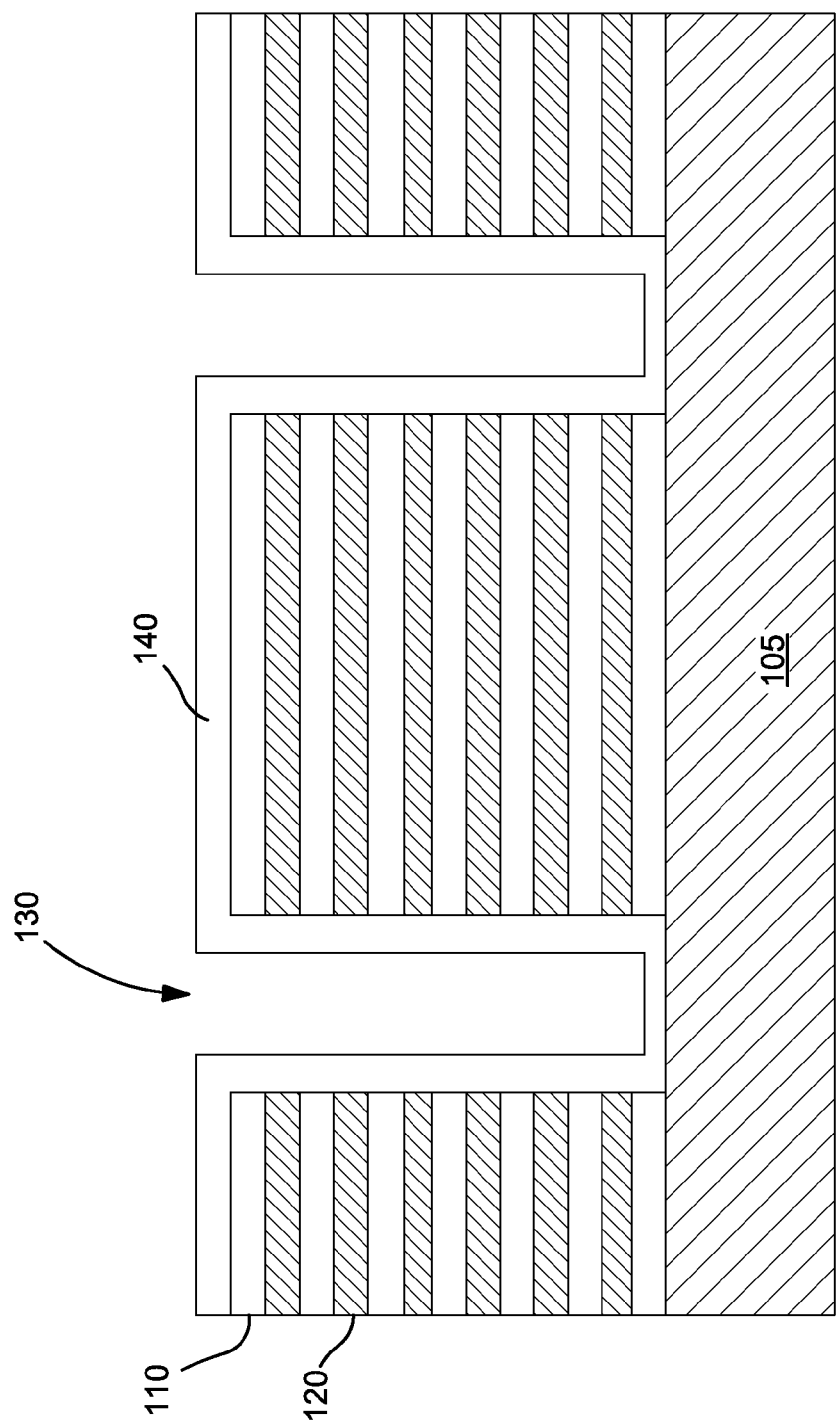
FIG. 1 shows an intermediate process step in the creation of a NVM memory device.

The creation of a vertical NVM device requires a plurality of process steps to build the three-dimensional structure. During an intermediate process step, shown in FIG. 1, the vertical NVM device 100 has a plurality of alternating first layers 110 and second layers 120, deposited on top of the substrate 105. These alternating layers may be used to form an ONO (oxide-nitride-oxide) stack. This stack may comprise alternating layers of silicon nitride and silicon oxide. In other embodiments, this stack may comprise alternating layers of different compositions, such as an oxide or other dielectric and a metal. In some embodiments, the top layer or layers of the stack may be made thicker than the rest of the layers so that they can block ions that are implanted during a subsequent step from penetrating the stack. This top layer or layers may be used as a sacrificial layer, in that it will later be removed. The thickness of this sacrificial layer may be dictated by the depth to which ions penetrate the stack during subsequent process steps, as described in more detail below. In other embodiments, after the stack has been created, a deposition of another material, different from that used in the first layer 110 and the second layer 120, is applied to act as a sacrificial layer. This sacrificial layer may be made using a heavier material, due to its ability to inhibit the passage of implanted ions.

Vertical holes 130 are then created in this stack, such as by using high resolution lithography and etching techniques. These vertical holes 130 may extend through the stack and to the substrate 105. These vertical holes 130 may be circular, rectangular or have any other desired shape and may have a depth of 2 μm and a width of only 20 nm, thereby having an aspect ratio, defined as the depth of the feature divided by its width, of 100. In other embodiments, these vertical holes may have an aspect ratio greater than 50. High aspect ratio (HAR) features may be any feature having an aspect ratio of 10 or more.

After the vertical holes 130 have been created, a material which will ultimately become doped, is deposited on the sidewalls of the vertical holes 130. This material, referred to as the wall material 140, may be deposited using traditional deposition processes, or may be deposited using atomic layer deposition (ALD). In some embodiments, this wall material 140 may be polycrystalline silicon, amorphous silicon, crystalline silicon, tantalum pentoxide ($Ta_2O_5$), tantalum, a tantalum oxide ($TaO_x$), tungsten, a tungsten oxide ($WO_x$), hafnium or a hafnium oxide ($HfO_x$), although the composition of the wall material 140 is not limited by this disclosure. In some embodiment, such as that shown in FIG. 1, the wall material 140 may also be deposited on the upper surface of the stack. In some embodiments, the wall material 140 may be a plurality of vertical layers. For example, the wall material 140 may include a first material deposited against the side walls of the hole 130, and a second material deposited on that first material.

Figure 2:
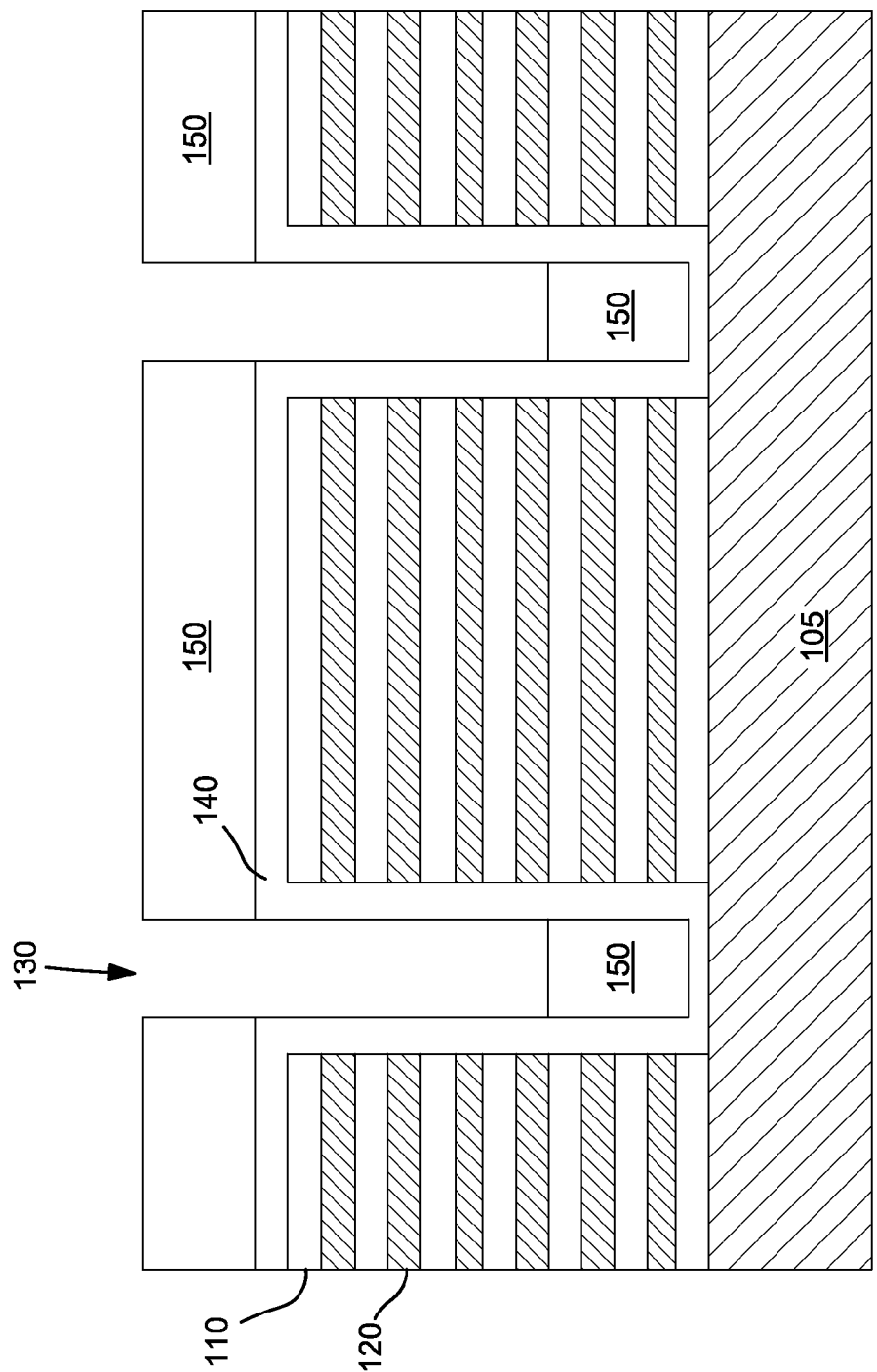
FIG. 2 shows an intermediate process step in accordance with a first embodiment of the creation of a doped sidewall in the device of FIG. 1.

According to one embodiment, shown in FIG. 2, a fill material 150 is deposited using a deposition technique, such as by using high density plasma chemical vapor deposition (HDPCVD), atomic layer deposition (ALD), chemical vapor deposition (CVD), physical vapor deposition (PVD), sputtering or other techniques. The fill material 150 fills a portion of the vertical hole 130 and also accumulates on the top surface of the stack. In some embodiments, an etch process is performed at the top of the vertical hole 130 so that the deposited fill material 150 does not constrict the width of the vertical hole 130; a condition known as necking.

In some embodiments, the fill material 150 that is deposited on the top surface of the stack is removed, such as by a preferential etch or a planarization step, such as CMP. In other embodiments, the fill material 150 may remain on the top surface of the stack to protect the stack from the subsequent ion implantation.

The choice of fill material 150 may be determined based on the dopant ions which are to be implanted into the wall material 140. For example, the fill material 150 may be comprised of a compound which has the desired dopant as one of its elements. For example, if the desired dopant to be used in the wall material 140 is aluminum, the fill material may be $Al_2O_3$. In another example, if the desired dopant is oxygen, the fill material 140 may be $SiO_2$. In another embodiment, the desired dopant may be co-deposited with another species to form the fill material 150. For example, boron or phosphorus may be co-deposited with a silicon-based material, such as silicon or silicon dioxide, as the fill material 150. In this example, the boron or phosphorus is the desired dopant. In another embodiment, the fill material 150 is deposited and the dopant species is implanted thereafter to allow the introduction of the desired species into the fill material 150. Thus, the fill material 150 contains the desired dopant ions, either as a part of the molecular structure, as a co-deposited species, or as a subsequently implanted species. These desired dopant ions will be implanted into the wall material 140 in a subsequent step. It is noted that while the term dopant is used to describe ions 151 that are implanted in the wall material 140, it is understood that this term also includes any species that affects the properties of the wall material 140, such as conductivity, stoichiometry, damage profile, diffusion characteristics or other properties. Thus, in addition to traditional p-type and n-type silicon dopants, such as boron, aluminum and phosphorus, dopant ions 151 (see FIG. 3) may also comprise other species, such as oxygen.

Figure 3:
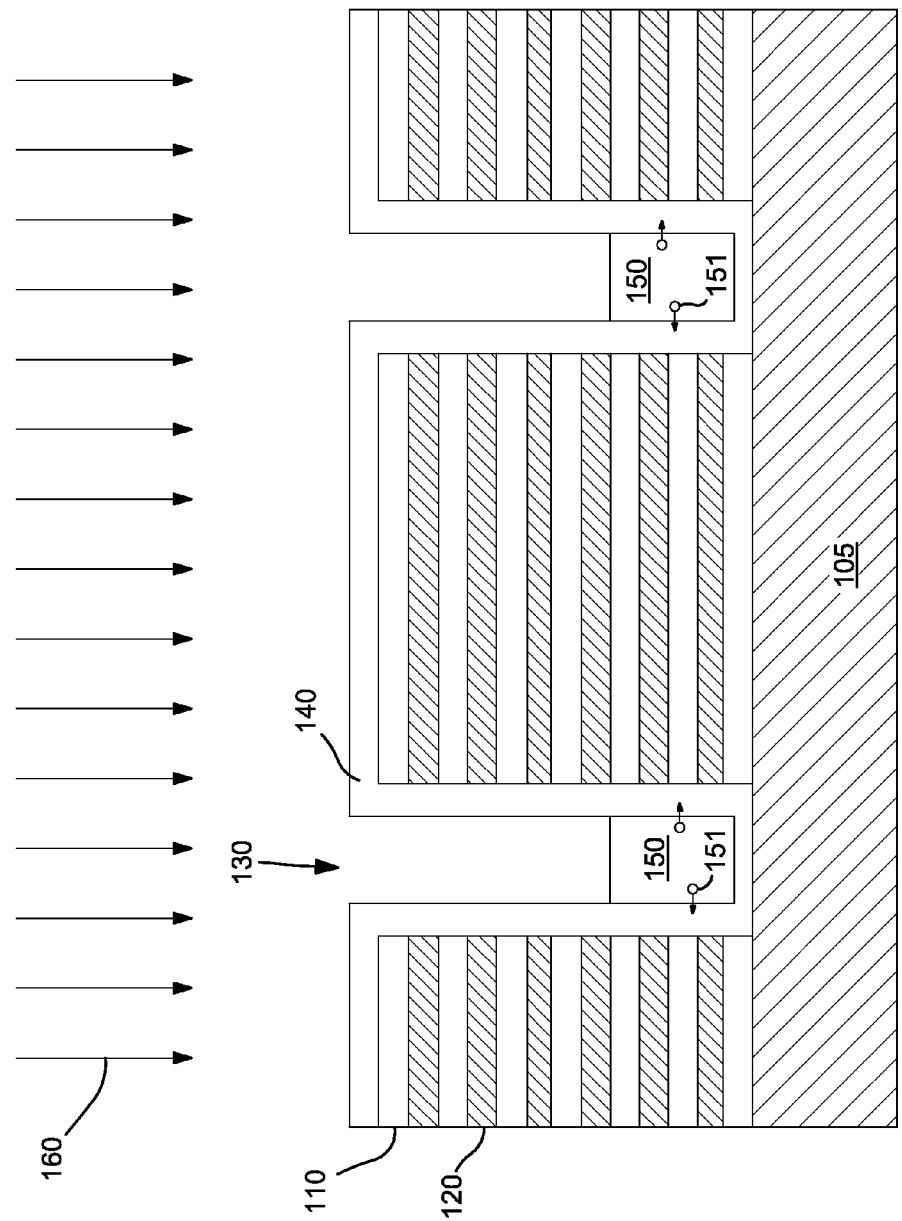
FIG. 3 shows a second intermediate process step in accordance with the first embodiment of the creation of a doped sidewall in the device of FIG. 1.

After the fill material 150 has been deposited into a portion of the vertical hole 130, an implantation step using ions 160 of a first species is performed, as shown in FIG. 3. In this embodiment, the fill material 150 has been removed from the top surface of the stack, but this is not required in all embodiments. The purpose of the ion implant is to cause ions 151 in the fill material 150 to disperse laterally into the adjacent wall material 140. This concept is known as knock-in, where a vertical ion implant also causes movement of ions 151 in the implanted fill material 150.

The ion implant may be performed using the same species of ions 160 as is to be implanted in the wall material 140. For example, in some embodiments, knock-in may be maximized when the implanted ions 160 and the ions 151 intended for lateral movement are the same mass and/or the same species. Thus, if it is desirous to implant aluminum into the wall material 140, the fill material 150 that is deposited may be $Al_2O_3$, and the ion implantation may be performed using Al+ ions. Alternatively, if it is desirous to implant boron or phosphorus, the fill material 150 may be p- or n-doped silicon dioxide or silicon, and the ion implantation may be performed using B or P ions, respectively. In another embodiment, the ion implantation may be performed with silicon. Other ions 151 may be implanted into the wall material 140, using a variety of fill materials 150 and ion species 160. This ion implant is preferably performed at an angle normal to the top surface of the stack.

In addition, the use of the same species for ions 160 and ions 151 may have other benefits. For example, as ions 160 are implanted in the fill material 150, they cause ions 151 to knock-in to the adjacent wall material 140. This necessarily decreases the number of ions 151 that are available for knock-in during subsequent implants. However, if ions 160 are the same species as ions 151, the previously implanted ions 160, which now are disposed in the fill material 150, effectively become ions 151, available for knock-in during subsequent implants. Furthermore, ions 160 may be implanted in the wall material 140 via lateral straggle as well. These ions 160 may also contribute to the total dose required in the wall material 140.

In another embodiment, the species 160 may be selected such that they do not change the wall material 140 in an appreciable way. For example, the wall material 140 may comprise a particular atom, such as silicon, and the ion species 160 may also include that ionized atom. In this way, lateral straggle of ions 160 may not significantly impact the properties of wall material 140. In one further embodiment, the ions 151 may be boron or phosphorus. In this embodiment, the ions 160, which may be silicon, may cause the boron ions 151 to penetrate more deeply into the wall material 140 due to their higher mass. In addition, any silicon ions 160 that experience lateral straggle do not affect the wall material 140.

The implant energy of the ion implant affects the degree of knock-in. For example, a higher implant energy may cause ions 151 to move a greater distance laterally. In some embodiments, it may be desirous that the ions 151 are implanted in the wall material 140, and do not pass beyond the wall material 140 and into the stack. In other embodiments, if the wall material 140 comprises a plurality of vertical layers, it may be desirous for the ions 151 to penetrate some of these layers, but not other layers. Therefore, the implant energy may be determined based on producing a knock-in distance such that ions 151 penetrate the wall material 140 but do not pass through that material. Thus, in one embodiment, the implant energy may be determined based on the desired knock-in. Once the implant energy has been determined, the thickness of the deposition of fill material 150 can be determined. For a given implant energy, the implanted ions 160 will penetrate into the fill material 150 to a determined depth. This relationship also depends on the selection of ion species 160 and the composition of the fill material 150. For example, a lighter mass fill material 150, such as carbon, may allow ions 160 to penetrate to a greater depth than a heavily material, such as silicon dioxide.

In some embodiments, the ion implant is performed as a chained implant, where the implant energy is varied to allow knock-in to occur at a plurality of depths. Thus, the term "implant" as used herein, is used to describe the implantation of ions 160 at one or more implant energies when a specific amount of fill material 150 is deposited. In other words, all implants that are performed while the fill material 150 is at a given depth, regardless of implant tool, ion species or implant energy, is described herein as an implant.

Chained implants may allow the creation of controlled dopant concentration profiles in the vertical direction along wall material 140. For example, high implant energies may allow the ions 160 to penetrate the fill material 150 more deeply, and cause knock-in in this region. Lower implant energies do not penetrate the fill material 150 as deeply and may cause knock-in at a region closer to the top surface of the fill material 150. The dose at each implant energy may be chosen to result in the required dopant profile. For example, if the deposition process results in a concentration profile of atoms 151 in fill material 150 that varies with depth, the dose of ions 160 at different energies can be adjusted to account for this.

The depth to which the ions 160 penetrate may define the thickness of the fill material 150 deposition, as knock-in cannot occur below this depth. After the ion implantation has been performed, the wall material 140 that is disposed adjacent to the fill material 150 will have been doped with the desired dopant.

In other embodiments, the penetration of ions 151 past the wall material 140 may not be detrimental. In these embodiments, the implant energy used for the ion implant may be determined based on the capabilities of the ion implanter or other factors. For example, the implant energy may be limited to minimize damage to the surrounding stack. As described above, a chained implant, using multiple implant energies and/or ion species, may be performed at each ion implantation step. As described above, the thickness of the fill material 150 deposition is determined by the depth to which the ions 160 penetrate the fill material 150 at the specified implant energy.

Figure 4:
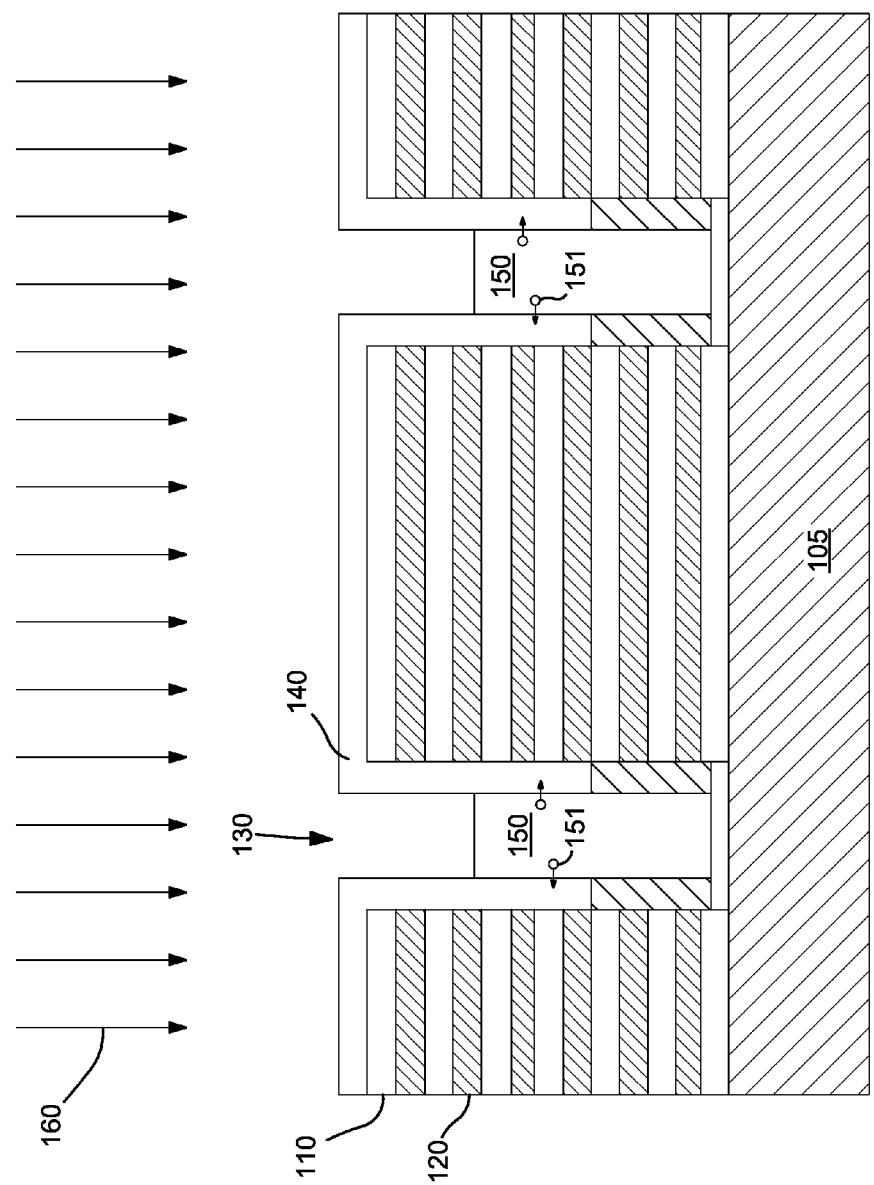
FIG. 4 shows a third intermediate process step in accordance with a first embodiment of the creation of a doped sidewall in the device of FIG. 1.

This sequence is then repeated, by depositing another layer of fill material 150 in the vertical hole 130 and the top surface of the stack, as shown in FIG. 4. The thickness of this layer of fill material 150 may be the same as the previous layer and may be chosen based on the ability for ions to penetrate the entire thickness of the newly deposited layer. However, in other embodiments, the thickness of the newly deposited layer may be greater than or less than the previously deposited layer.

The fill material 150 deposited on the top surface of the stack may be removed as described previously. The wall material 140 that was previously implanted via knock-in is now shown in crosshatch in FIG. 4. A subsequent ion implant may be performed using the same implant energies and ion species 160 as was used during the first ion implant. In other embodiments, different implant energies or ion species may be used. As a result of this second implant, another portion of the wall material 140 becomes implanted by ions 151 via knock-in within the fill material 150. This process of depositing a thickness of fill material 150 into the hole 130, and implanting ions 160 into the newly deposited fill material 150 to cause knock-in in the adjacent wall material 140 is repeated until the entire hole 130 has been filled and the entire height of the wall material 140 is doped. In some embodiments, this sequence of deposition and implantation may be repeated ten times to achieve the desired pattern. In other embodiments, this sequence may be repeated in a greater or fewer number of times. In one embodiment, the entire hole 130 may be filled and implanted in a single sequence, such as by using a chained implant utilizing multiple implant energies.

After the process is completed, the wall material 140 may have a uniform dopant concentration throughout the entire depth of the vertical hole 130. However, in other embodiments, it may be desirable to tune the dopant concentration of the wall material 140 as a function of depth in the vertical hole 130. For example, more (or less) dopant may preferably be implanted in the wall material 140 near the bottom of the deep hole 130. In this case, the implant energies and dose of the various implants may differ. A greater implant energy and dose may cause a greater concentration of dopant in the wall material 140.

Once the entire height of the wall material 140 has been implanted, the fill material 150 may optionally be removed from the hole 130, such as by using an etching process. In other embodiments, it may be acceptable or preferable to allow the fill material 150 to remain in the hole 130. Once these steps are completed, fabrication of the NVM device may continue in accordance with known techniques.

Figure 8:
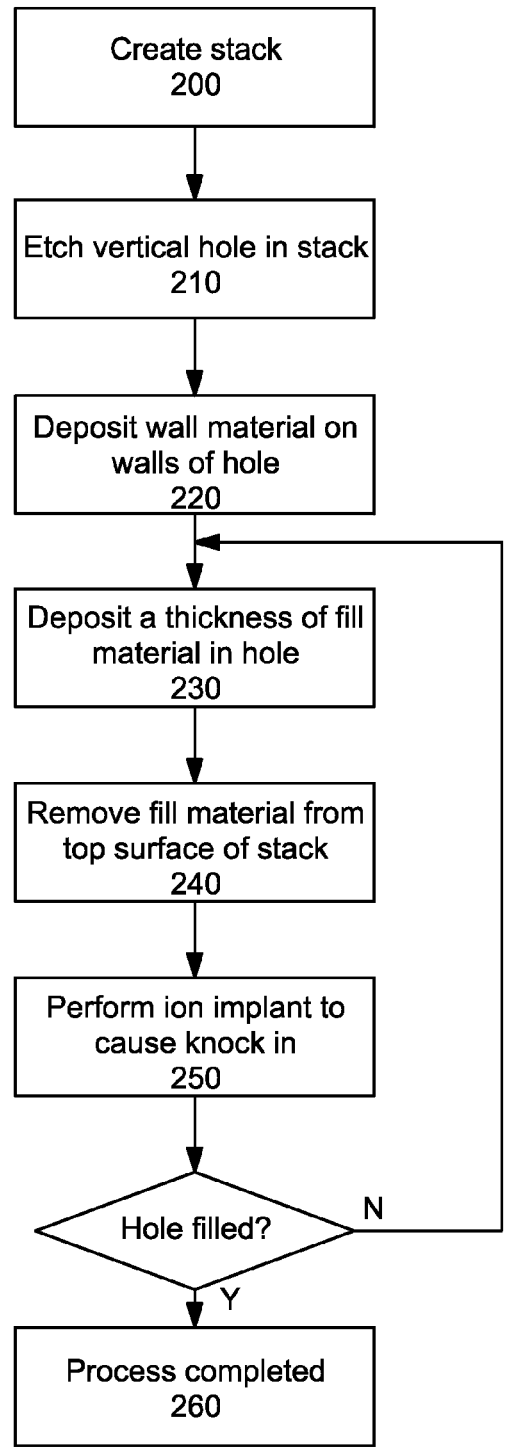
FIG. 8 is a representative flowchart of the first embodiment of the fabrication process shown in FIGS. 2-4.

This first embodiment discloses a process where a thickness of fill material 150 is added, an ion implant is performed to cause knock-in of ions 151 in the fill material 150, and these steps are repeated until the hole 130 has been filled with fill material 150. A summary of this process is shown in FIG. 8. First, a stack of alternating layers, such as oxide and nitride, or dielectric and metal, are created, as shown in step 210. Then, a vertical hole 130 is etched in the stack, as shown in step 210. The sidewalls of the hole 130 are deposited with a wall material 140, as shown in step 220. A thickness of fill material 150 is then deposited on the structure, thereby filling a portion of the hole 130, as shown in step 230. Optionally, the fill material 150 that was deposited on top of the stack is removed, as shown in step 240. An ion implantation is then performed using ions 160 to cause knock-in of ions 151 within the fill material 150, as shown in step 250. This serves to create a dopant concentration in the wall material 140 disposed adjacent to the implanted fill material 150. If the hole is not yet filled, process steps 230, 240 and 250 are repeated. Once the hole is filled, the process is complete, as shown in step 260.

Figure 5:
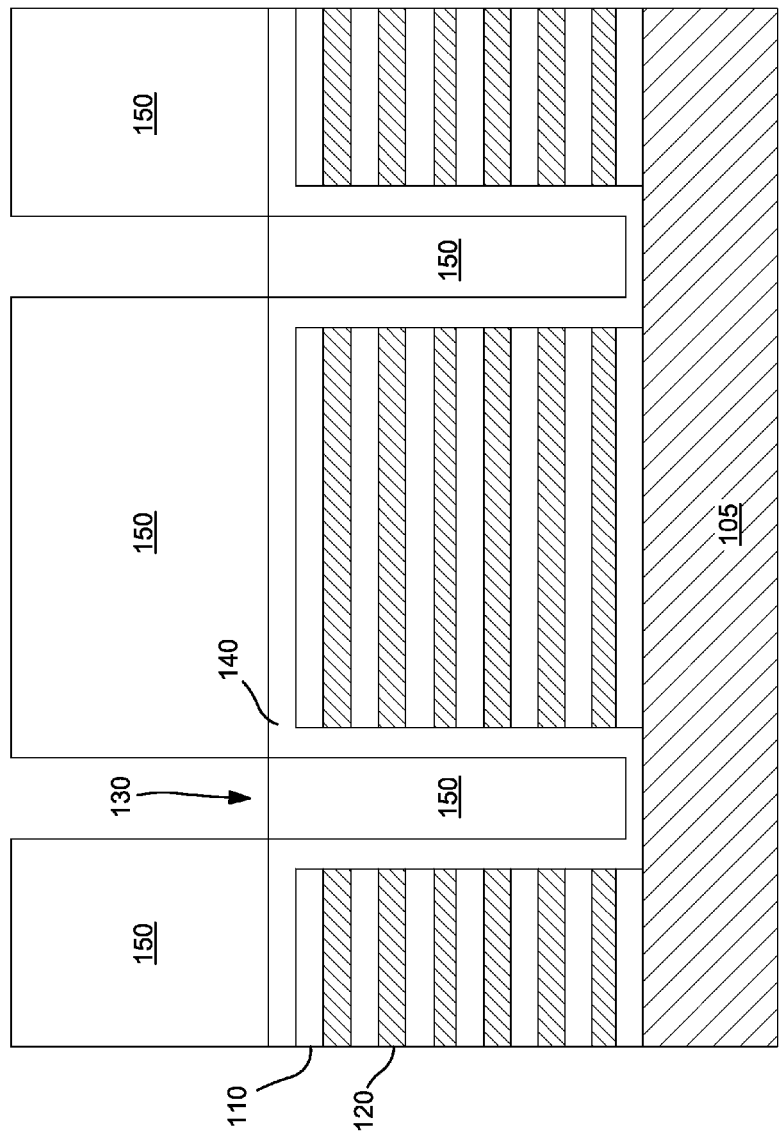
FIG. 5 shows an intermediate process step in accordance with a second embodiment of the creation of a doped sidewall in the device of FIG. 1.

In a second embodiment, this process is performed in a different order. In this embodiment, the fill material 150 is deposited so as to completely fill the vertical hole 130, as shown in FIG. 5. The composition of the fill material 150 may be the same as that described earlier with respect to the first embodiment.

As described above, the fill material 150 that is deposited on the top surface of the stack may be removed such as by using an etching process or CMP. In other embodiments, the fill material 150, or a portion of the fill material 150 may be left on the top surface of the stack to protect the underlying stack from the subsequent ion implants.

Figure 6:
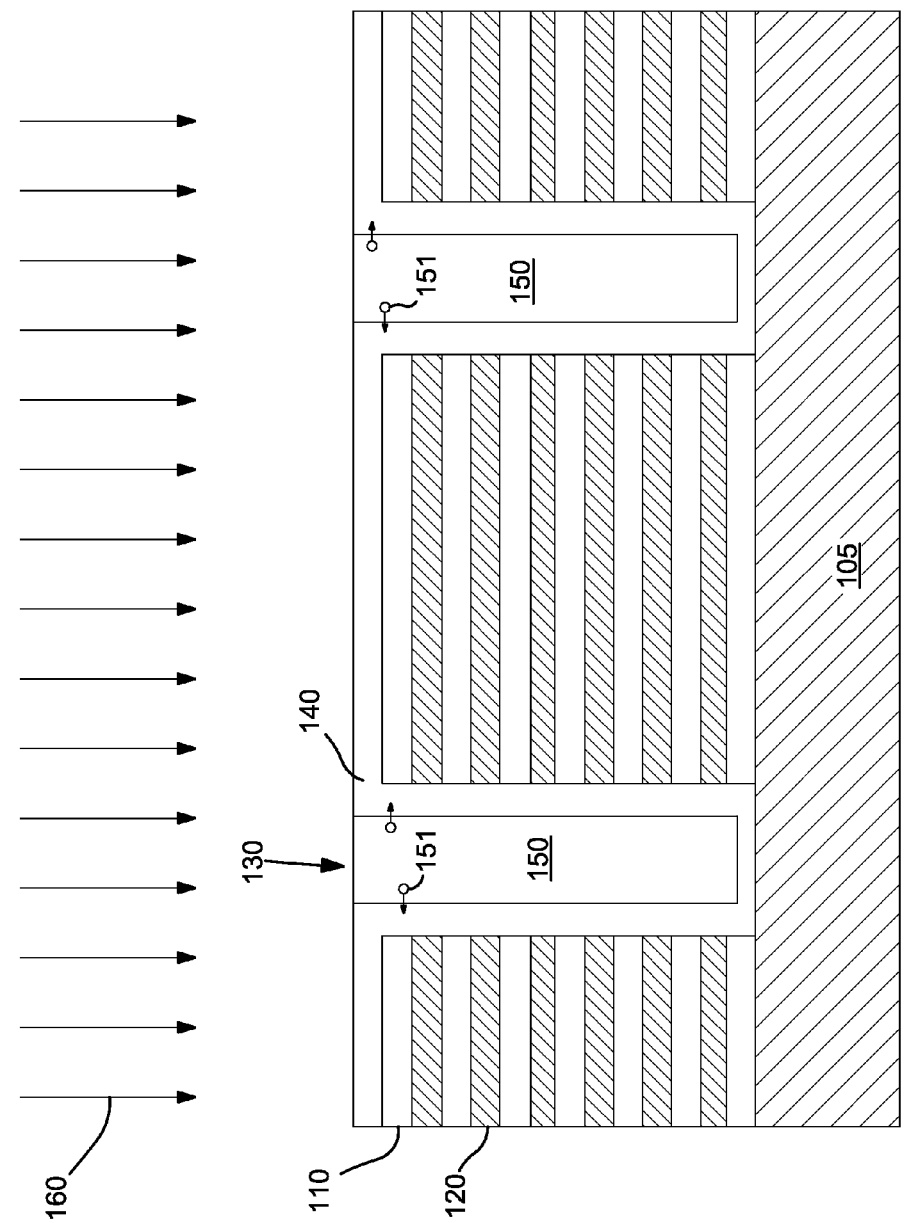
FIG. 6 shows a second intermediate process step in accordance with the second embodiment of the creation of a doped sidewall in the device of FIG. 1.

After the deposition of fill material 150, an ion implantation using ion species 160 is performed as shown in FIG. 6. As described above, the ion implant may be a single implant or a set of chained implants at different implant energies. This first ion implant causes knock-in in the region near the top surface of the fill material 150, such that ions 151 are deposited laterally into the wall material 140. This ion implant is preferably performed at an angle normal to the top surface of the stack. As described above, the ions 160 used for this implant may be the same mass and/or species as those ions 151 that are introduced via knock-in. In one embodiment, the implant energies used for ion implant may be determined based on the desired knock-in of ions 151. As stated earlier, the amount and distance of knock-in may be related to the implant energies of the ion implant.

Figure 7:
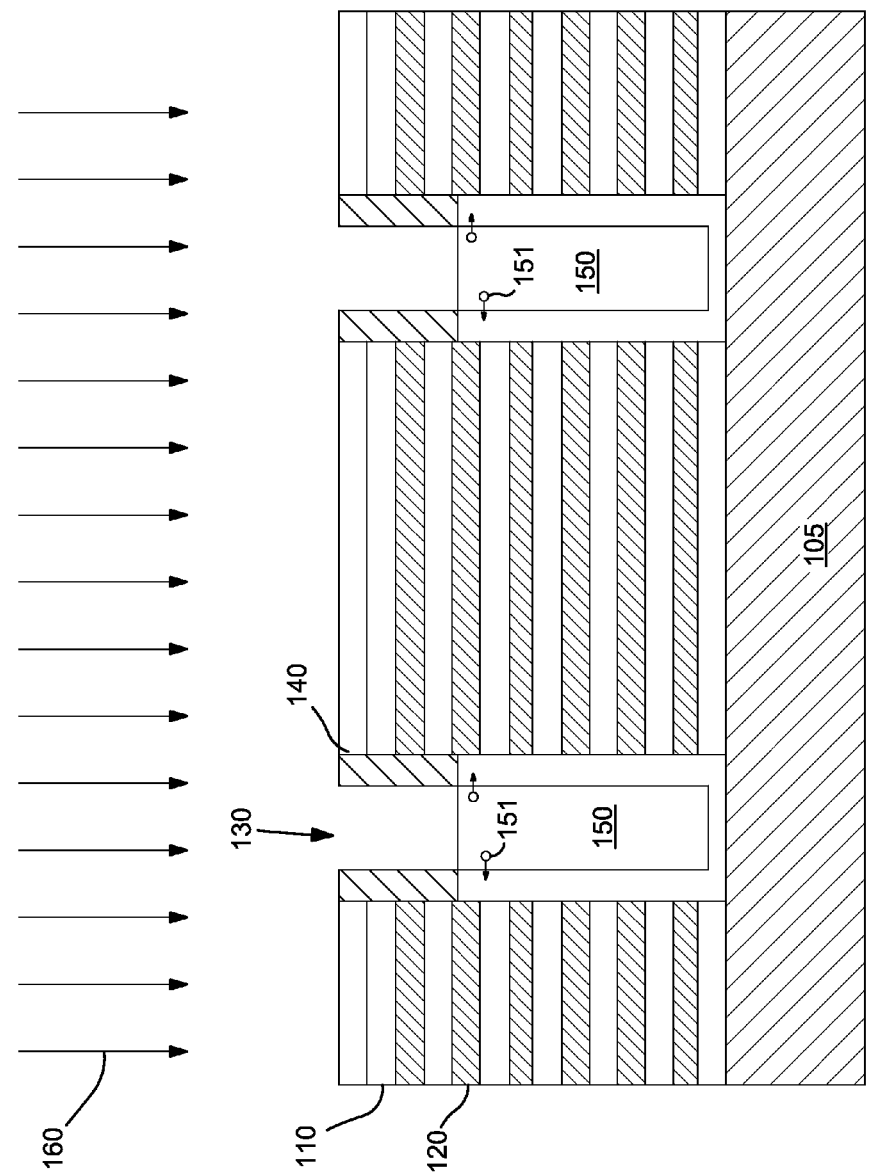
FIG. 7 shows a third intermediate process step in accordance with the second embodiment of the creation of a doped sidewall in the device of FIG. 1.

After the ion implant is completed, as determined by the doping concentration of the wall material 140, some of the fill material 150 is removed, as shown in FIG. 7. This thickness of fill material 150 may be removed using an etching process. The exposed wall material 140, shown now in crosshatch in FIG. 7 has been implanted to the desired dopant concentration via knock-in during the previous ion implant. The thickness of fill material 150 removed may be related to the depth to which knock-in occurred during the previous ion implantation. After this thickness of fill material 150 has been removed, a second ion implant is performed so as to dope the wall material 140 adjacent to the fill material 150 remaining in the hole 130. This sequence of removing fill material 150 and performing an ion implantation process is repeated until the entirety of the wall material 140 has been implanted. The number of these sequences may vary. For example, ten sequences may be required to dope the entirety of the wall material 140. In other embodiments, fewer sequences are needed. In one embodiment, the entirety of the wall material 140 may be implanted via knock-in through the use of chained implants performed while the fill material 150 fills the entire hole 130.

Figure 9:
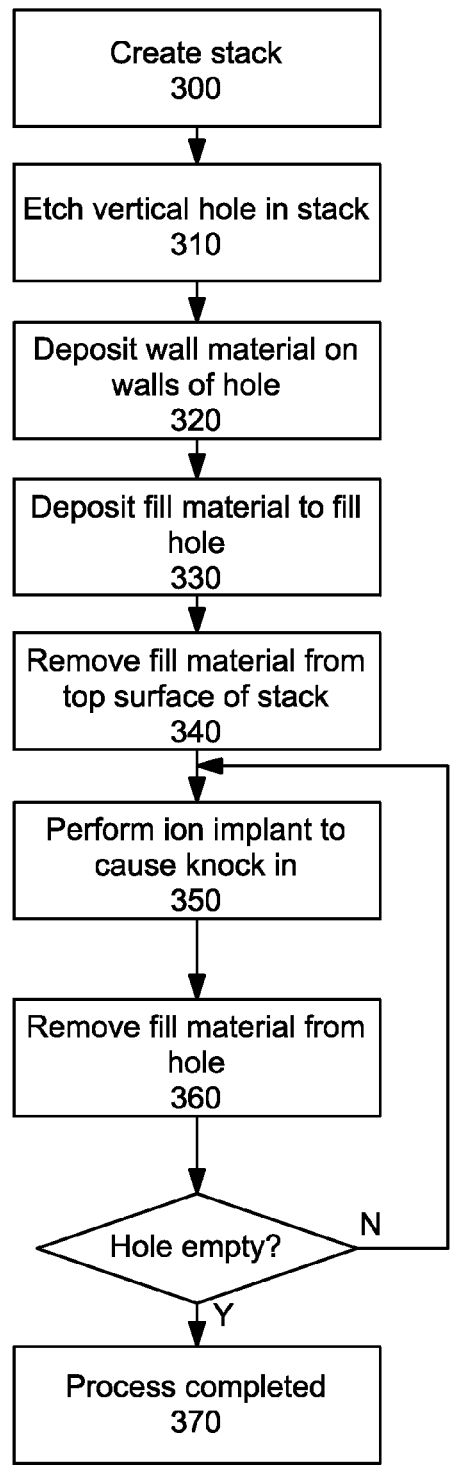
FIG. 9 is a representative flowchart of the fabrication process shown in FIGS. 5-7.

FIG. 9 shows a representative process flow for this embodiment. The stack is created, a vertical hole 130 is etched through this stack and a wall material 140 is deposited on the sidewalls of the hole 130, as described above and shown in steps 300-320. The hole 130 is then completely filled with fill material 150, as shown in step 330. Optionally, the fill material 150 that was deposited on the top of the stack may be removed, as shown in step 340. After this, an implant using ions 160 is performed to cause knock-in, as shown in step 350. A thickness of fill material 150 is then removed from the hole 130, as shown in step 360. This thickness may be related to the depth to which knock-in occurred during the previous implant. If all of the fill material 150 has not yet been removed from the hole 130, the process steps 350, 360 are repeated. Once all of the wall material 140 has been doped, the process ends, as shown in step 370.

In each of the embodiments described above, the ion implants are performed using appropriate implant energies and doses so as to create a uniform dopant concentration profile in the wall material 140. In other embodiments, the implants energies and doses of the ion implants may be varied to create a variable dopant concentration profile. For example, the dopant concentration may be a gradient where the wall nearest the bottom of the hole 130 is most heavily (or lightly) doped.

In other embodiments, a device parameter of the NVM device may be optimized by varying the various ion implants. For example, the threshold voltage of each cell in a FLASH device may be a critical device parameter. For example, a higher threshold voltage may be used to compensate for a thin charge trap stack or a shorter device channel length. In other embodiments, higher threshold voltages may be required near the top (or bottom) of the hole 130. In other embodiments, NVM cell device parameters such as high and low resistance state, set voltage, reset voltage and forming voltage may be critical parameters that may be optimized. This can be readily accomplished by varying the implant energies and durations of the various ion implants.

For example, in some embodiments, the important device parameters of the NVM device may be measured after the device has been completely processed. Variations in these measured device parameters can be used to feedback changes to the implant energy and dose applied to the fill material 150 to alter the threshold voltages for subsequently processed NVM devices. In other words, the process also includes measuring the device parameters of a previously fabricated structure, and optimizing the doping concentration profile of a subsequent device based on these measured device parameters. This feedback may be used to affect an operating parameter of the implant, such as the implant dose, implant energy or another operating parameter.

After the completion of this process, the wall material 140 will have the desired doping concentration, which may be about 1E17 atoms/cm$^3$ or more for a NAND FLASH channel. In addition, the doping concentration may be uniform throughout the height of the vertical channel. In other embodiments, the doping concentration of the wall material 140 may vary as a function of the height to optimize device parameters, such as the threshold voltage of the charge traps, high or low resistance states, set or reset voltages or forming voltages in a resistive memory cell.

In another embodiment, metrology information from a partially completed device may be used to influence implant parameters. For example, the doping concentration of the deposited material 140 may be measured during the fabrication process. The implant parameters may be modified based on this measured concentration. In another example, the thickness of the wall material 140 may be measured during the fabrication process, and the implant parameters may be modified based on this measured thickness.

Note that, in the sequences shown in FIGS. 8-9, one or more ion implants may be performed. These ion implants may have a deleterious effect on the uppermost layers of the stack. For example, the implanting of ions 160 into the stack may impact the performance of the NVM device. As described earlier, sacrificial layers may be included in the stack. These sacrificial layers may be the same material as used for the first and second layers, or may be a different material. In one embodiment, these sacrificial layers may be removed after the ion implantations steps are completed, such as by MCP or etching. The removal of these sacrificial layers results in an stack that has not been contaminated by the ion implants. In other words, if the desired stack is to have 8 sets of alternating oxide and nitride layers or 8 sets of alternating dielectric and metal layers, it may be advantageous, in some embodiments, to apply at least one extra layer or set of alternating layers. These extra layers are added with the expectation that they will be contaminated by the ion implants and will thereafter be removed. In other words, rather than introducing another process step to add a mask on top of the stack, the stack is simply extended such that the top layer or layers serve as a mask (albeit a more porous mask). As described above, the sacrificial layer or layers may be thicker than the other layers in the stack.

While the disclosure describes the use of ion implants to cause knock-in at a particular step in the fabrication sequence, the disclosure is not limited to this embodiment.

The present disclosure shows the process steps associated with the formation of a NVM device in accordance with a particular process. It is understood that this includes NAND FLASH devices, and resistive memory devices, such as ReRAM, CBRAM and PCRAM devices. In addition, this technique can be used in conjunction with other three-dimensional semiconductor structures which have deep sidewalls or other high aspect ratio features that need to be doped.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed:

1. A process of doping a sidewall in a three-dimensional structure, where the three-dimensional structure comprises a stack of alternating layers of different compositions, comprising:

etching a hole through said stack, said hole having a depth and a width;

depositing a wall material along sides of said hole;

depositing a thickness of fill material in said hole after depositing of said wall material, where said fill material comprises a first species to be implanted in said wall material via knock-in; and implanting a second species into said deposited fill material, said second species having a mass and energy so as to cause said first species to be laterally dispersed into said wall material adjacent said deposited fill material.

2. The process of claim 1, wherein said thickness of said deposited fill material is less than said depth of said hole.

3. The process of claim 2, further comprising:

performing a subsequent deposition of a thickness of fill material into said hole after said implanting; and performing a subsequent implanting of said second species into said fill material, whereby a different portion of said wall material is implanted by knock-in.

4. The process of claim 3, wherein said subsequent deposition and said subsequent implanting steps are repeated until said fill material completely fills said hole.

5. The process of claim 1, wherein said thickness of fill material deposited is determined based on the degree of knock-in desired.

6. The process of claim 1, wherein said thickness of said fill material deposited equals said depth of said hole, and further comprising:

removing a second thickness of said fill material from said hole; and performing a subsequent implanting of said second species into said fill material that remains, whereby a different portion of said wall material is implanted by knock-in.

7. The process of claim 6, wherein said second thickness of fill material removed is determined based on the depth of knock-in achieved in a previous implanting step.

8. The process of claim 6, wherein said removing and implanting steps are repeated until an entire depth of said wall material has been implanted.

9. The process of claim 1, further comprising:

measuring a device parameter in a previously fabricated structure;

using said measured device parameter to determine an optimized doping concentration profile of said wall material; and altering a parameter of at least one of said implants to create said optimized doping concentration.

10. The process of claim 1, further comprising:

gathering metrology information from a partially fabricated structure;

using said gathered information to determine an optimized doping concentration profile of said wall material; and altering a parameter of at least one of said implants to create said optimized doping concentration.

11. A process of doping a sidewall in a three-dimensional structure, comprising:

depositing an alternating pattern of first and second layers on a substrate, to form a stack;

etching a hole through said stack;

depositing a wall material on walls of said hole;

depositing a fill material into said hole, where said fill material comprises a first species to be implanted in said wall material via knock-in;

implanting a second species into said deposited fill material, wherein said ions are implanted into said fill material and on top of said stack; and removing at least one layer from said top of said stack after said implanting.

12. The process of claim 11, wherein said removed layer comprises at least one of said first and second layers.

13. The process of claim 11, further comprising:
depositing a layer of a third material to top of said stack prior to said etching; and
removing said layer of said third material after said implanting step.

14. A process of doping a sidewall in a non-volatile memory device, comprising:
depositing an alternating pattern of first and second layers on a substrate, to form a stack;
etching a hole through said stack, said hole have a depth and a width;
depositing a wall material on walls of said hole;
depositing a thickness of fill material in said hole after depositing of said wall material, said thickness being less than said depth of said hole, where said fill material comprises a first species to be implanted in said wall material via knock-in;
implanting a second species into said deposited fill material, said second species being of a mass and energy so as to cause said first species to be laterally dispersed into said wall material adjacent said deposited fill material;
performing a subsequent deposition of a thickness of fill material into said hole after said implanting;
performing a subsequent implanting of said second species into said fill material, whereby a different portion of said wall material is implanted by knock-in; and
repeating said deposition and implanting steps until said hole is filled with fill material.

15. The process of claim 14, wherein said fill material comprises boron doped silicon-based material and said second species comprises silicon.

16. The process of claim 14, wherein said first species comprises a metal.

17. The process of claim 14, wherein said first species comprises oxygen.

18. The process of claim 14, further comprising:
gathering metrology information from a partially fabricated device;
using said gathered information to determine an optimized doping concentration profile of said wall material; and
altering a parameter of at least one of said implants to create said optimized doping concentration.

* * * * *